United States Patent
Kim et al.

(10) Patent No.: US 11,818,527 B2
(45) Date of Patent: *Nov. 14, 2023

(54) DISPLAY APPARATUS

(71) Applicant: LG Display Co., Ltd., Seoul (KR)

(72) Inventors: Seunghyeon Kim, Paju-si (KR); SeulKi Nam, Paju-si (KR); Taehyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,061

(22) Filed: Jul. 25, 2022

(65) Prior Publication Data

US 2022/0369011 A1    Nov. 17, 2022

Related U.S. Application Data

(63) Continuation of application No. 16/919,805, filed on Jul. 2, 2020, now Pat. No. 11,432,060.

(30) Foreign Application Priority Data

Jul. 4, 2019    (KR) .................. 10-2019-0080583

(51) Int. Cl.
  *H04R 1/02*    (2006.01)
  *H05K 5/00*    (2006.01)
  *H05K 5/03*    (2006.01)

(52) U.S. Cl.
  CPC .......... *H04R 1/028* (2013.01); *H05K 5/0017* (2013.01); *H05K 5/03* (2013.01); *H04R 2499/15* (2013.01)

(58) Field of Classification Search
  CPC ................................. H04R 1/028; H04R 1/02
  See application file for complete search history.

(56) References Cited

U.S. PATENT DOCUMENTS

| 2004/0163883 A1 | 8/2004 | Suzuki |
| 2006/0091773 A1 | 5/2006 | Kim et al. |

(Continued)

FOREIGN PATENT DOCUMENTS

| CN | 108124218 A | 6/2018 |
| CN | 109963236 A | 7/2019 |

(Continued)

OTHER PUBLICATIONS

Office action dated Jan. 24, 2023 for Japanese patent application No. 2022-015049.

(Continued)

*Primary Examiner* — Olisa Anwah
(74) *Attorney, Agent, or Firm* — Morgan, Lewis & Bockius LLP

(57) ABSTRACT

The present disclosure relates to a display apparatus, and more particularly, to a display apparatus having a display panel capable of generating sound. A display apparatus according to the present disclosure includes: a display module; a guide panel disposed at circumferences of a rear surface of the display module; a back cover attached to the guide panel; a sound generating unit disposed between the display module and the back cover; and an adhesive fixing element and a vibration absorber disposed between the guide panel and the rear surface of the display module, wherein the adhesive fixing element fasten the guide panel to the rear surface of the display module, and wherein the vibration absorber is disposed at the guide panel as facing to inner portions of the display module.

22 Claims, 5 Drawing Sheets

(56) References Cited

U.S. PATENT DOCUMENTS

| | | |
|---|---|---|
| 2010/0171898 A1 | 7/2010 | Lee |
| 2013/0039021 A1 | 2/2013 | Liu |
| 2014/0004288 A1* | 1/2014 | Wakayama ................ C09J 7/22 |
| | | 428/521 |
| 2015/0341714 A1 | 11/2015 | Ahn et al. |
| 2015/0350775 A1 | 12/2015 | Behles et al. |
| 2015/0382490 A1 | 12/2015 | Shen |
| 2017/0280216 A1 | 9/2017 | Lee et al. |
| 2017/0280234 A1* | 9/2017 | Choi ...................... H04R 7/045 |
| 2017/0292691 A1 | 10/2017 | Coo |
| 2018/0052339 A1 | 2/2018 | Ma et al. |
| 2018/0270570 A1 | 9/2018 | Choi et al. |
| 2019/0028787 A1 | 1/2019 | Masuda et al. |
| 2019/0037164 A1* | 1/2019 | Kim .................... H04R 17/005 |
| 2019/0141450 A1 | 5/2019 | Yoon et al. |
| 2019/0019624 A1 | 6/2019 | Shin et al. |
| 2019/0182572 A1 | 6/2019 | Kim |
| 2019/0196247 A1 | 6/2019 | Shin et al. |
| 2020/0314551 A1* | 10/2020 | Kim ...................... H04R 17/00 |
| 2022/0006478 A1 | 1/2022 | Yu et al. |

FOREIGN PATENT DOCUMENTS

| | | |
|---|---|---|
| JP | 2004-260346 A | 9/2004 |
| JP | 2010199818 A | 9/2010 |
| JP | 2014131300 A | 7/2014 |
| JP | 2014-174391 A | 9/2014 |
| JP | 2015-219528 A | 12/2015 |
| KR | 10-2019-0033277 A | 3/2019 |
| WO | 2016067667 A1 | 5/2016 |
| WO | 2018070399 A1 | 4/2018 |

OTHER PUBLICATIONS

Office Action, issued in corresponding Chinese Patent Application No. 202010630932.X, dated Aug. 4, 2021.
Office Action, issued in corresponding Japanese Patent Application No. 2020-116044, dated Aug. 11, 2021.

* cited by examiner

DISPLAY APPARATUS

CROSS-REFERENCE TO RELATED APPLICATIONS

This is a continuation of U.S. patent application Ser. No. 16/919,805, filed on Jul. 2, 2020, which claims the benefit of Korean Patent Application No. 10-2019-0080583 filed on Jul. 4, 2019, the entirety of each of which is incorporated herein by reference as if fully set forth herein.

BACKGROUND

Technical Field

The present disclosure relates to a display apparatus, and more particularly, to a display apparatus having a display panel capable of generating sound.

Discussion of the Related Art

Generally, display apparatus, such as a television, a monitor, a notebook computer, a smartphone, a tablet computer, an electronic pad, a wearable device, a watch phone, a portable information device, a navigation device, or a vehicle control display include a display panel to display an image.

The general display apparatus may include a display panel for representing various video images, and a sound apparatus to output sound related to the image.

However, in the display apparatus of the related art, because sound generated by the sound apparatus is output in a direction toward a rear surface or a side surface of a main body (or housing), rather than to a front surface of a display panel, sound may not travel toward a viewer (or a user) who watches an image in front of the display panel. Thus, immersion of the viewer who watches the image may be disturbed.

SUMMARY

The inventors of the present application recognize the problems with a general display apparatus, and have made various experiments for improving the sound quality and for aiming the direction of the sound to the front of the display panel when viewing an image from the front of the display panel. After various experiments, a display apparatus having a new structure capable of generating sound that can proceed in front of the display panel and improving the sound quality is proposed.

Accordingly, embodiments of the present disclosure are directed to a display apparatus that substantially obviates one or more of the problems due to limitations and disadvantages of the related art.

An aspect of the present disclosure according to one example is to provide a display apparatus capable of accurate sound transmission. An aspect according to an example of the present disclosure is to provide a display apparatus capable of generating sound that can be propagated in front of the display panel.

Another aspect of the present disclosure according one example is to provide a display apparatus capable of improving the sound quality and increasing the immersion of the viewer. Still another aspect of the present disclosure according to one example is to provide a display apparatus that suppresses the vibration reflected from the edge of the display panel, as vibrating the display panel directly, for generating high-quality sound.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises: a display module; a guide panel disposed at circumferences of a rear surface of the display module; a back cover attached to the guide panel; a sound generating unit disposed between the display module and the back cover; and an adhesive fixing element and a vibration absorber disposed between the guide panel and the rear surface of the display module, wherein the adhesive fixing element fasten the guide panel to the rear surface of the display module, and wherein the vibration absorber is disposed at the guide panel as facing to inner portions of the display module.

In one example, the display module includes: a cover glass having a display area and a non-display area surrounding the display area; and a display panel attached to a rear surface of the cover glass as being corresponding to the display area.

In one example, the guide panel include: a fixing area corresponding to an outer area; and a vibration absorbing area disposed to the inner portion of the display panel from the fixing area, wherein the adhesive fixing element is disposed at the fixing area, and wherein the vibration absorber is disposed at the vibration absorbing area.

In one example, the fixing area of the guide panel is thicker than the vibration absorbing area of the guide panel.

In one example, the guide panel includes a rigid area and an elastic area, the vibration absorber is corresponding to the elastic area as being one body with the guide panel, the guide panel is fastened to the display module by the adhesive fixing element, and the rigid area of the guide panel is attached to the back cover.

In one example, the vibration absorber includes at least one of: a plurality of extended protrusions extended to the inner portions of the display module; and a plurality of recessed protrusions recessed to outer portions of the display module.

In one example, at least one of the extended protrusions and the recessed protrusions is disposed at least one of four corners of the display module.

In one example, at least one of the extended protrusions and the recessed protrusions is disposed at two sides of the display module parallel each other.

In another aspect, a display apparatus comprises: a display module including a display area and a non-display area surrounding the display area; an adhesive fixing element disposed at circumference area on a rear surface of the non-display area; a guide panel attached to the adhesive fixing element; a vibration absorber disposed at an inner area from the circumference area, on the rear surface of the non-display area; a back cover attached to a rear surface of the guide panel; and a sound generating unit disposed at the back cover.

In one example, the display module includes: a cover glass having the display area and the non-display area; and a display panel disposed on a rear surface of the cover glass as corresponding to the display area, wherein the sound generating unit is attached at a rear surface of the display panel.

In one example, the guide panel includes: a fixing area corresponding to the circumference area; and a vibration absorbing area corresponding to the inner area, wherein the adhesive fixing element is disposed at the fixing area, and wherein the vibration absorber is disposed at the vibration absorbing area.

In one example, the fixing area of the guide panel has thicker thickness than the vibration absorbing area, and the vibration absorber is in contact with the rear surface of the display module in the vibration absorbing area, and is attached to the guide panel.

In one example, the guide panel is disposed at the inner area of the non-display area, the vibration absorber is attached at an upper surface of the guide panel, and is in contact with the rear surface of the non-display area, and the adhesive fixing element is attached to the vibration absorber and the guide panel.

In one example, the guide panel includes: a rigid area disposed at the circumference area; and an elastic area disposed at the inner area, wherein an upper surface of the guide panel is attached to the rear surface of the non-display area of the display module by the adhesive fixing element, and wherein an lower surface of the guide panel is attached to the back cover.

In one example, the vibration absorber includes at least one of: a plurality of extended protrusions extending to inner portions of the display module, and a plurality of recessed protrusions recessed to outer portions of the display module.

The display apparatus according to the present disclosure can accurately transmit sound, and capable of improving sound quality and increasing viewer immersion.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Figure 1:
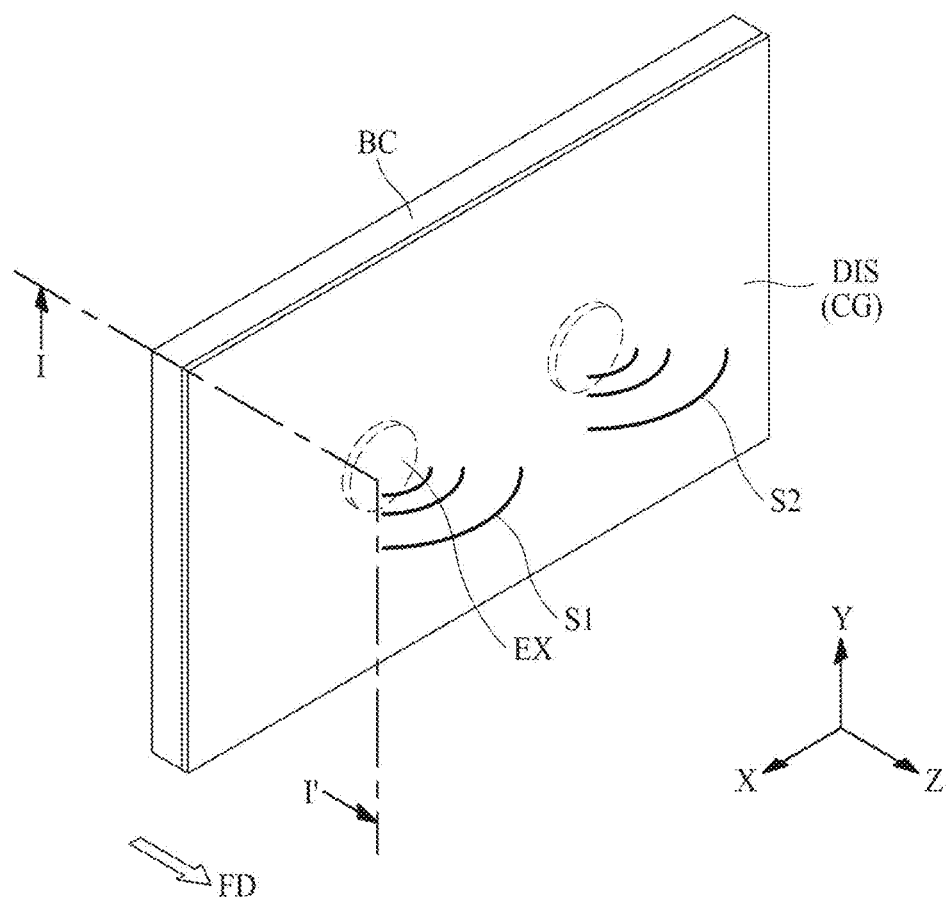
FIG. 1 is a diagram illustrating a display apparatus having a sound generating unit at the rear surface of the display panel according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

The 'display apparatus' in this application may comprise a liquid crystal module (LCM), an organic light emitting display module (OLED Module), or a quantum dot module (QD Module) which are have a display panel and a driver for driving the display panel. The 'display apparatus' may further comprise a complete product or final product including LCM, OLED Module or QD Module such as a notebook computer, a television set, a computer monitor, an equipment apparatus having an automotive apparatus or other modules for vehicle, a set electronic apparatus or a set device (or set apparatus) such as a smart phone or a mobile electronic apparatus.

Therefore, the 'display apparatus' may be any one of a display device such as LCM, OLED Module and QD Module, an application device including LCM, OLED Module or QD Module, or a set apparatus for end user's final devices.

In another example, the LCM, OLED Module or QD Module may be referred to the 'display apparatus', and the final electronic devices including LCM, OLED Module or QD Module may be referred to the 'set apparatus'. For example, the display apparatus may include a display panel of liquid crystal display or organic electroluminescence display, and a source printed circuit board (PCB) for driving the display panel. The set apparatus may include the display apparatus and a set PCB or control PCB for driving the set apparatus itself by connecting to the display apparatus and the source PCB.

The display panel according to the embodiments of the present disclosure may include a liquid crystal display panel, an organic light emitting diode display panel, and an electroluminescent display panel, but it is not limited thereto. For example, display panel may have any structure in which the display panel may be vibrated to generate sound. In addition, the display panel applied to the display apparatus according to the embodiment of the present disclosure is not limited to the shape or size of the display panel.

In the case that the display panel is the liquid crystal display panel, the display panel may include a plurality of gate lines, a plurality of data lines, and a plurality of pixels (or sub pixels) defined by the gate lines and the data lines. The display panel may include an array substrate including thin film transistor as a switching element for controlling the light transmittance of each pixel, an upper substrate including a color filter and/or a black matrix, and a liquid crystal layer disposed between the array substrate and the upper substrate.

In the case that the display panel is an organic light emitting diode display panel, the display panel may include a plurality of gate lines, a plurality of data lines, and a plurality of pixels (or sub pixels) defined by the gate lines and the data lines. The display panel may include an array substrate including thin film transistor for applying the electric voltage to each pixel selectively, an organic light emitting layer on the array substrate, and an encapsulation substrate disposed on the array substrate for covering the organic light emitting layer. The encapsulation substrate may protect the thin film transistor and the organic light emitting layer from any external shocks, and prevent moisture and oxygen from penetrating into the organic light emitting layer. In addition, the organic light emitting layer formed on the array substrate may be replaced by the inorganic light emitting layer, the quantum dot light emitting layer, or the micro light emitting diode element.

The display apparatus including the sound generating module according to the present disclosure may be applied to the vehicle as the user interface module such as the central control panel in the automobile. For example, the display panel may be installed at the center fascia between the driver seat and the assistant seat so that the vibration of the display panel propagates toward the interior space of the vehicle. Therefore, the in-car audio can be improved compared to having conventional speakers only at inside sides of the car.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

FIG. 1 is a diagram illustrating a display apparatus having a sound generating unit at the rear surface of the display panel according to the present disclosure. Referring to FIG. 1, the display apparatus according to the present disclosure may generate the sounds S1 and S2 in accordance to the vibration of the display module DIS. For example, in the display apparatus, the display module DIS may be vibrated by the vibration generating device (or sound generating device) EX so as to make the sound S1 and S2. Most of sounds S1 and S2 generated by the vibration of the display module DIS may directly propagate to the front direction FD of the display apparatus. Therefore, by using the display module DIS as the vibrating plate (or tympanum) for generating the sounds, the display apparatus according to the presented disclosure may exactly provide the sound, improve the sound quality and enhance the immersion of the viewer.

In the display apparatus according to the present disclosure, the sound generating unit may provide the force of vibration to the display module DIS so that the display module DIS makes the sound. Since the display module DIS may use a vibrating substrate, such as a cover glass CG, acoustic vibration may be canceled or disturbed due to the vibration reflection from the edge portion of the cover glass CG, thereby degrading the sound quality. In order to solve this problem, the present disclosure provides a structure for suppressing the reflected vibration. Hereinafter, various embodiments of the present disclosure will be described in detail with drawings.

First Embodiment

Figure 2:
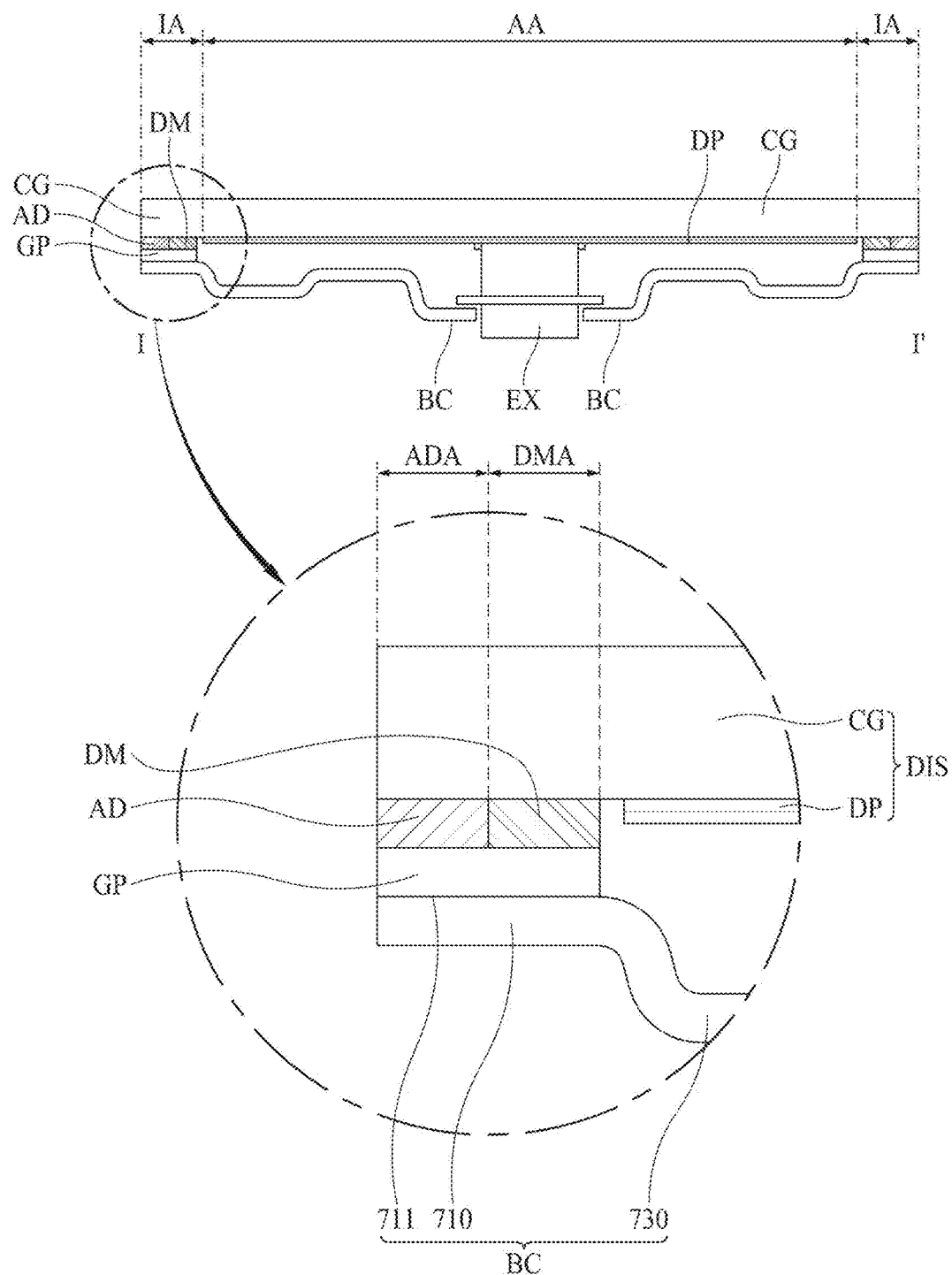
FIG. 2 is a cross-sectional view along cutting line I-I' in FIG. 1, for illustrating a structure of a display apparatus according to the first embodiment of the present disclosure.

FIG. 2 is a cross-sectional view along cutting line I-I' in FIG. 1, for illustrating a structure of a display apparatus according to the first embodiment of the present disclosure.

Referring to FIG. 2, the display apparatus according to the first embodiment of the present disclosure may comprise a display module DIS, a guide panel GP, a back cover BC, an adhesive fixing element AD, a vibration absorber DM and a sound generating unit EX. The display module DIS may include a liquid crystal display module, but it is not limited thereto. For example, the display module DIS may include any one of an electroluminescent display module, an electrophoresis display module, a micro LED display module, an electronic wetting display module, and a quantum dot light emitting display module.

The display module DIS may include a display panel DP and a cover glass CG. The cover glass CG may include a display area AA and a non-display area IA. The display area AA is the portions for representing the video images, and the non-display area IA is the portions surrounding the display area AA which may not provide any video images. However, in some cases, the non-display area IA may provide additional video images or picture images. The display panel DP may be attached at inner surface of the display area AA of the cover glass CG.

The display panel DP is the element for displaying the video images and may be represented as the electroluminescent display panel. Even though not shown in figures, an external circuit part may be disposed at the non-display area IA of the cover glass CG for driving the display element.

The back cover BC may be attached at the rear surface of the display module DIS. In detail, the guide panel GP may be attached at non display area IA of the display module DIS. In addition, the back cover BC may be attached at the rear surface of the guide panel GP. Even though not shown in figures, the guide panel GP and the back cover BC may be joined each other by a joining element such as the adhesive or the fastening screws.

The back cover BC may have a plurality of bend shapes for reinforcing the strength so that it may not have the flat surface. The back cover BC may include a coupling portion 710 for joining with the guide panel GP and a body portion 730 curved and extended from the coupling portion 710. The coupling portion 710 may include a coupling face 711 that is surface-jointed to the guide panel GP. Although not shown in figures, an adhesive may be interposed between the coupling surface 711 and the guide panel GP, and may include a fixing member such as a screw that penetrates the coupling portion 710 to fasten the guide panel GP.

The sound generating unit EX may be disposed at a portion of the display area AA in the back cover BC. In figures, the sound generating unit EX is installed at the through hole penetrating a portion of the back cover BC. However, it is not limited thereto, the sound generating unit EX may be attached at the inner surface of the back cover BC. That is, the sound generating unit EX may be disposed within the space between the display module DIS and the back cover BC.

In addition, in figures, the sound generating unit EX is directly attached at the rear surface of the display module DIS. This is just one example of preferable structures of the present disclosure, so it is not limited thereto. For another example, the sound generating unit EX is installed at the rear side of the display module DIS with a predetermined gap so that the vibration may not directly provide to the display module DIS but provide the sound pressure through the air there-between.

The guide panel GP may be attached as corresponding to the non-display area IA of the display module DIS. For example, the rear surface of the guide panel GP may be attached to the back cover BC, and the front surface of the guide panel GP may be attached at the rear surface of the display module DIS using an adhesive fixing element AD. In addition, the vibration absorber DM is disposed between the guide panel GP and the rear surface of the display panel DIS. The vibration absorber DM may be made of a material having very high elasticity. The vibration absorber DM may be in close contact with the upper (or front) surface of the guide panel DP and the rear surface of the display module DIS.

The guide panel GP may include an adhesive fixing area ADA and a vibration absorption (or damping) area DMA. The adhesive fixing area ADA refers to an area where the guide panel GP is adhesively fixed to the display module DIS. The vibration absorption area DMA is an area adjacent to the adhesive fixing area ADA at the inner side in the guide panel GP, and refers to an area absorbing the vibration generated from the sound generating unit EX without reflecting the vibration.

The adhesive fixing element AD is a medium for adhesively joining the guide panel GP to the display module DIS, and may be formed of an organic adhesive material, a photo-curable adhesive material, or a heat-curable adhesive material. However, it is not limited thereto, the adhesive fixing element AD may include any adhesive medium capable of combining the guide panel GP and the display module DIS.

When vibration occurs from the sound generating unit EX, the vibration is propagated to the display module DIS and sound is generated in accordance with the force or energy of the vibration. Since the guide panel GP is firmly adhered to the edge of the display module DIS by the adhesive fixing member AD, the acoustic vibrations are reflected from the adhesive fixing member AD to the center of the display module DIS. The echo vibration may cancel or interfere with the acoustic vibration continuously occurring from the sound generating unit EX or adversely affect the acoustic vibration, so that the sound quality may be deteriorated.

However, the display apparatus according to the first embodiment of the present disclosure may further include the vibration absorber DM adjacent to the adhesive fixing element AD between the adhesive fixing element AD and the sound generating unit EX. The vibration absorber DM may absorb and remove the echo vibration, thereby maintaining the acoustic vibration generated in the sound generating unit EX in the un-distorted state.

In the figures, the shape of the vibration absorber DM is shown as a rectangular shape. However, in other cases, a round chamfer shape may be provided at the edge portions of the display module DIS, or a diagonal chamfer shape may be provided. Such a chamfered shape may prevent the vibration transmitted from the display module DIS from generating noise due to collision or friction with the end of the vibration absorber DM.

In the first embodiment, the adhesive fixing area ADA and the vibration absorbing area DMA are disposed together in the guide panel GP. Accordingly, the adhesive fixing element AD and the vibration absorber DM are disposed in the non-display area IA occupied by the guide panel GP, thereby an effect of efficiently absorbing the vibration transmitted from the display module DIS, while having a narrow bezel structure, can be expected.

Second Embodiment

Figure 3:
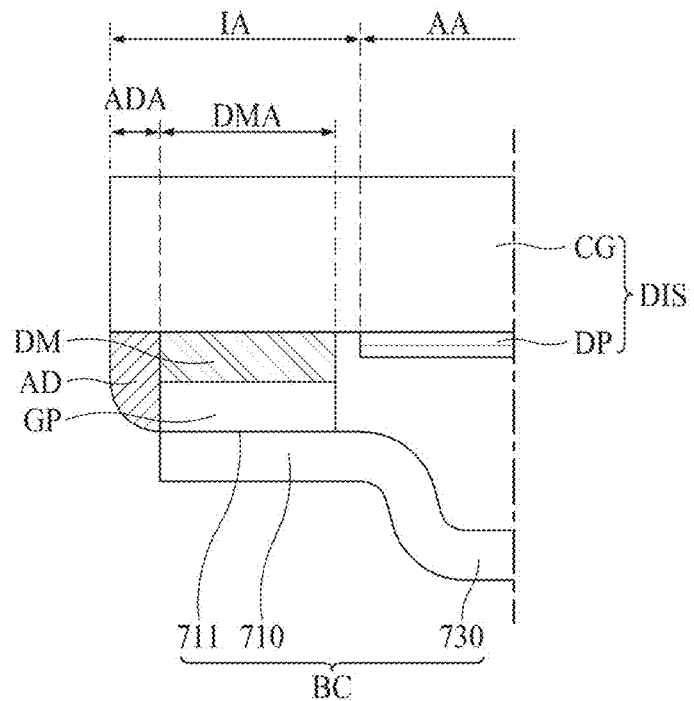
FIG. 3 is an enlarged cross-sectional view along cutting line I-I' in FIG. 1, for illustrating a structure of a display apparatus according to the second embodiment of the present disclosure.

FIG. 3 is an enlarged cross-sectional view along cutting line I-I' in FIG. 1, for illustrating a structure of a display apparatus according to the second embodiment of the present disclosure. The second embodiment of the present disclosure according to FIG. 3 has a structure basically similar to the display apparatus according to the first embodiment. As for the difference, it is in the arrangement structure of the vibration absorber DM and the adhesive fixing element AD disposed between the guide panel GP and the display module DIS. FIG. 3 is an enlarged view of a portion of the vibration absorber DM, and shows enlarged features of the second embodiment. For components not shown in FIG. 3, the description in the first embodiment is referred to.

Referring to FIG. 3, the display apparatus according to the second embodiment of the present disclosure may comprise a display module DIS, a guide panel GP, a back cover BC, an adhesive fixing element AD, a vibration absorber DM and a sound generating unit EX.

The display module DIS may include a display panel DP and a cover glass CG. The cover glass CG may include a display area AA and a non-display area IA. The display panel DP may be attached at inner surface of the display area AA of the cover glass CG.

The back cover BC may be attached at the rear surface of the display module DIS. In detail, the guide panel GP may be attached at non display area IA of the display module DIS. In addition, the back cover BC may be attached at the rear surface of the guide panel GP.

The back cover BC may include a coupling portion 710 for joining with the guide panel GP and a body portion 730 curved and extended from the coupling portion 710. The coupling portion 710 may include a coupling face 711 that is surface-jointed to the guide panel GP.

The sound generating unit EX may be disposed at a portion of the display area AA in the back cover BC. Here, the sound generating unit EX is not illustrated, but may be arranged as the same structure of the first embodiment.

The guide panel GP may be disposed as corresponding to the non-display area IA of the display module DIS. For example, the rear (or bottom) surface of the guide panel GP may be attached to the back cover BC and the vibration absorber DM may be disposed at the front surface of the guide panel GP. Here, the vibration absorber DM may be attached to the guide panel GP or may be combined or joined in a close contact.

In the second embodiment, the adhesive fixing member AD may have a structure in which it covers the rear surface of the display module DIS, the outer side of the vibration absorber DM and the outer side of the guide panel GP, and connects these surfaces.

In the second embodiment, the vibration absorber DM may have a structure in close contact with the entire guide panel DP and the rear surface of the display module DIS. The vibration absorber DM may be adhered to the guide panel DP, or may simply maintain a close contact state with the guide panel DP. In addition, the vibration absorber DM may be adhered to the rear surface of the display module DIS, or may simply maintain a close contact state with the display module DIS.

The guide panel GP may include an adhesive fixing area ADA and a vibration absorption (or damping) area DMA. The adhesive fixing area ADA refers to an area where the guide panel GP is adhesively fixed to the display module DIS. The vibration absorption area DMA is an area adjacent to the adhesive fixing area ADA and corresponding to the guide panel GP, and refers to an area absorbing the vibration generated from the sound generating unit EX without reflecting the vibration.

In the first embodiment, the adhesive fixing area ADA is defined as a portion of the guide panel GP at an outer portion of the display module DIS, but in the second embodiment, the adhesive fixing area ADA is defined at an outside of the guide panel GP. In addition, in the first embodiment, the vibration absorbing area DMA is defined as an inner portion of the guide panel GP, but in the second embodiment, the guide panel GP itself is defined as the vibration absorbing area DMA.

Therefore, in the second embodiment, it is possible to ensure the space of the vibration absorber DM as wide as possible. As a result, various morphological changes may be added to the vibration absorber DM. For example, the sides of the vibration absorber DM may have a wave shape or a saw-tooth shape in addition to having a straight shape. In this case, the vibrations of various frequency bands transmitted from the display module DIS may be absorbed more efficiently.

The adhesive fixing element AD is a medium for adhesively joining the guide panel GP to the display module DIS, and may be formed of an organic adhesive material, a photo-curable adhesive material, or a heat-curable adhesive material.

When vibration occurs from the sound generating unit EX, the vibration is propagated to the display module DIS and sound is generated in accordance with the force or energy of the vibration. The display apparatus according to the second exemplary embodiment of the present disclosure may further include a vibration absorber DM disposed adjacent to the adhesive fixing element AD between the adhesive fixing element AD and the sound generating unit EX. The vibration absorber DM may absorb and remove the echo vibration, thereby maintaining the acoustic vibration generated in the sound generating unit EX in the un-distorted (or normal) state.

In the figures, the shape of the vibration absorber DM is shown as a rectangular shape. However, in other cases, a round chamfer shape may be provided at the edge portions of the display module DIS, or a diagonal chamfer shape may be provided. Such a chamfered shape may prevent the vibration transmitted from the display module DIS from generating noise due to collision or friction with the end of the vibration absorber DM.

Third Embodiment

Figure 4:
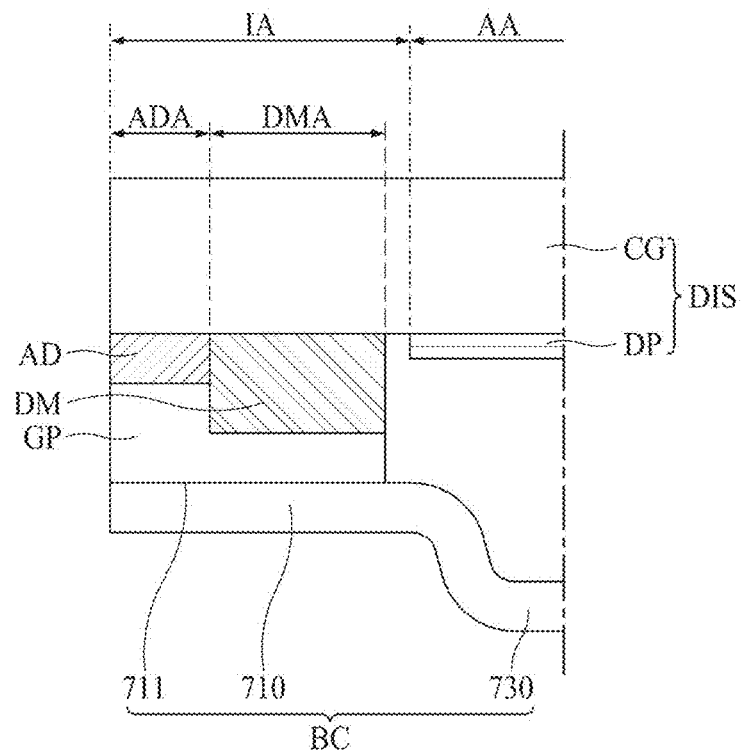
FIG. 4 is an enlarged cross-sectional view along cutting line I-I' in FIG. 1, for illustrating a structure of a display apparatus according to the third embodiment of the present disclosure.

FIG. 4 is an enlarged cross-sectional view along cutting line I-I' in FIG. 1, for illustrating a structure of a display apparatus according to the third embodiment of the present disclosure. The third embodiment of the present disclosure according to FIG. 3 has a structure basically similar to the display apparatus according to the first embodiment. The difference is on the cross sectional structure of the guide panel GP.

Referring to FIG. 4, the display apparatus according to the third embodiment of the present disclosure may comprise a display module DIS, a guide panel GP, a back cover BC, an adhesive fixing element AD, a vibration absorber DM and a sound generating unit EX.

The display module DIS may include a display panel DP and a cover glass CG. The cover glass CG may include a display area AA and a non-display area IA. The display panel DP may be attached at inner surface of the display area AA of the cover glass CG.

The back cover BC may be attached at the rear surface of the display module DIS. In detail, the guide panel GP may be attached at non display area IA of the display module DIS. In addition, the back cover BC may be attached at the rear surface of the guide panel GP.

The back cover BC may include a coupling portion 710 for joining with the guide panel GP and a body portion 730 curved and extended from the coupling portion 710. The coupling portion 710 may include a coupling face 711 that is surface-jointed to the guide panel GP.

The sound generating unit EX may be disposed at a portion of the display area AA in the back cover BC. The sound generating unit EX may be disposed at the space formed between the display module DIS and the back cover BC.

The guide panel GP may be attached as corresponding to the non-display area IA of the display module DIS. Between the guide panel GP and the rear surface of the display panel DIS, the vibration absorber DM is disposed. The vibration absorber DM may be in close contact with the upper surface of the guide panel GP and the rear surface of the display module DIS. In some cases, the vibration absorber DM is attached to the guide panel GP through an adhesive, and may simply maintain a close contact with the rear surface of the display module DIS.

The guide panel GP may include an adhesive fixing area ADA and a vibration absorption (or damping) area DMA. The adhesive fixing area ADA refers to an area where the guide panel GP is adhesively fixed to the display module DIS. The vibration absorption area DMA is an area adjacent to the adhesive fixing area ADA to the inner side in the guide panel GP, and refers to an area absorbing the vibration generated from the sound generating unit EX without reflecting the vibration.

In the third embodiment, the adhesive fixing area ADA of the guide panel GP may have a step pattern in which the thickness of the adhesive fixing area ADA of the guide panel GP is thicker than the thickness of the vibration absorbing area DMA of the guide panel GP. For example, when the adhesive fixing element AD uses a very thin double-side tape or a thinly applied adhesive material, it may be difficult for the vibration absorber DM to ensure a thickness suitable for absorbing vibration. In this case, referring to the thickness of the guide panel GP, some portions of the guide panel DP corresponding to the vibration absorbing area DMA may be removed to form a thinner thickness than the adhesive fixing area ADA.

In this case, the vibration absorber DM disposed in the vibration absorbing area DMA has a remarkably thick thickness. Therefore, the sound vibration generated by the sound generating unit EX and propagated through the display module DIS can be effectively absorbed, and the echo (or reflected) vibration can be completely blocked.

The structure of the display apparatus according to the third embodiment is suitable for ensuring a sufficient thickness of the vibration absorber DM when a very thin adhesive is used as the adhesive fixing element AD. For example, when the adhesive fixing element AD is an adhesive material having a thickness of several in order to prepare the vibration absorber DM having a thickness of several mm, the guide panel GP may be preferably formed to have a thickness suitable for mounting the vibration absorber DM in the vibration absorbing area DMA.

The display apparatus according to the third embodiment of the present disclosure may further comprise the vibration absorber DM disposed as in close to the adhesive fixing element AD between the adhesive fixing element AD and the sound generating unit EX. The vibration absorber DM may absorb and remove the echo vibration, thereby maintaining the acoustic vibration generated in the sound generating unit EX in the un-distorted state.

Fourth Embodiment

Figure 5:
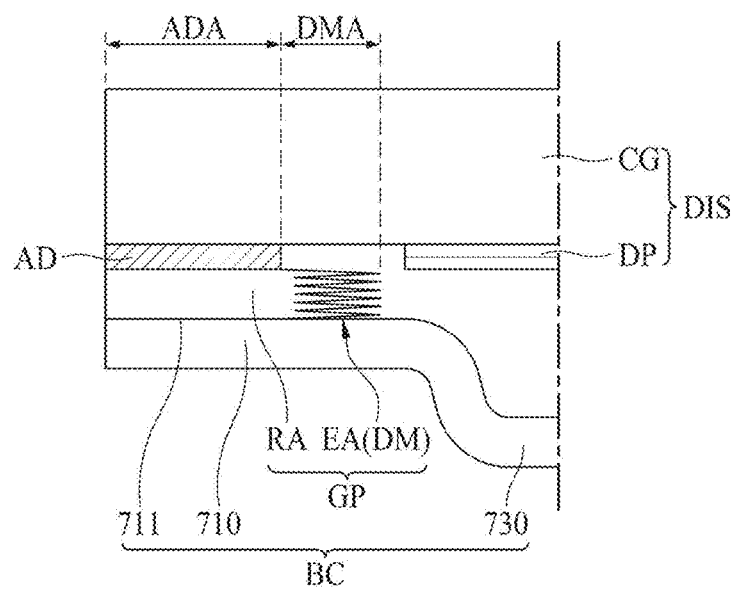
FIG. 5 is an enlarged cross-sectional view along cutting line I-I' in FIG. 1, for illustrating a structure of a display apparatus according to the fourth embodiment of the present disclosure.

FIG. 5 is an enlarged cross-sectional view along cutting line I-I' in FIG. 1, for illustrating a structure of a display apparatus according to the fourth embodiment of the present disclosure. In the fourth embodiment, the case in which the vibration absorber is not prepared separately, but some portion of the guide panel GP is used as the vibration absorber is illustrated.

Referring to FIG. 5, the display apparatus according to the fourth embodiment of the present disclosure may comprise a display module DIS, a guide panel GP, a back cover BC, an adhesive fixing element AD, a vibration absorber DM and a sound generating unit EX. The display module DIS may include a display panel DP and a cover glass CG. The cover glass CG may include a display area AA and a non-display area IA. The display panel DP may be attached at inner surface of the display area AA of the cover glass CG.

The back cover BC may be attached at the rear surface of the display module DIS. In detail, the guide panel GP may be attached at non display area IA of the display module DIS. In addition, the back cover BC may be attached at the rear surface of the guide panel GP.

The back cover BC may include a coupling portion 710 for joining with the guide panel GP and a body portion 730 curved and extended from the coupling portion 710. The coupling portion 710 may include a coupling face 711 that is surface-jointed to the guide panel GP.

The guide panel GP may be attached as corresponding to the non-display area IA of the display module DIS. For example, the lower surface of the guide panel GP may be attached to the back cover BC, and the upper surface of the guide panel GP may be attached to the rear surface of the display module DIS by the adhesive fixing element AD.

The guide panel GP may include an adhesive fixing area ADA and a vibration absorption (or damping) area DMA. The adhesive fixing area ADA refers to an area where the guide panel GP is adhesively fixed to the display module DIS. The vibration absorption area DMA is an area adjacent to the adhesive fixing area ADA to the inner side in the guide panel GP, and refers to an area absorbing the vibration generated from the sound generating unit EX without reflecting the vibration.

In the fourth embodiment, the guide panel GP may include a rigid area RA and an elastic area EA. The rigid area RA may be defined as the portion corresponding to the adhesive fixing area ADA. The elastic area EA may be defined as the portion corresponding to the vibration absorbing area DMA. Accordingly, in the fourth embodiment, the vibration absorber is not provided as a separated or additional element, but is replaced with an elastic part of the guide panel GP in the elastic area EA which is made by remodeling/reforming the properties and/or shape of part of the guide panel GP.

As the result, the area occupied by the guide panel GP can be freely designed, and then the guide panel GP according to the fourth embodiment can be applied to structures having various shapes.

In the fourth embodiment in which the vibration absorber DM is integrally formed in the guide panel GP itself, an advantage can be expected for minimizing the area of the non-display area IA in which the guide panel GP is disposed.

The rigid area RA may be a portion that is fixedly joining between the rear surface of the display module DIS and the back cover BC without elasticity. The elastic area EA is a portion extending from the rigid area RA toward the sound generating unit EX. There is a space between the rear surface of the display module DIS and the elastic area EA of the guide panel GP as shown in FIG. 5, but the present disclosure is not limited thereto.

In one example, the adhesive fixing element AD may be disposed on the upper surface of the elastic area EA as well as the rigid area RA of the guide panel GP, so that the entire guide panel GP may be fixed to the display module DIS. In this case, the sound vibration generated from the sound generating unit EX may be absorbed by the elastic force of the elastic area EA, so that the echo vibration may be eliminated or depressed.

In another example, the adhesive fixing element AD may be applied only to the rigid area RA of the guide panel GP, and the elastic area EA may be kept in close contact with the display module DIS. In that case, also, the sound vibration generated from the sound generating unit EX may be absorbed by the elastic force of the elastic area EA, so that the echo vibration may be eliminated, depressed or suppressed.

Until now, the arrangement and structure of the vibration absorber DM disposed on the rear surface of the display module DIS have been described in a cross-sectional view. Hereinafter, the structure of the vibration absorber DM on the plan view will be explained in detail.

Fifth Embodiment

Figure 6:
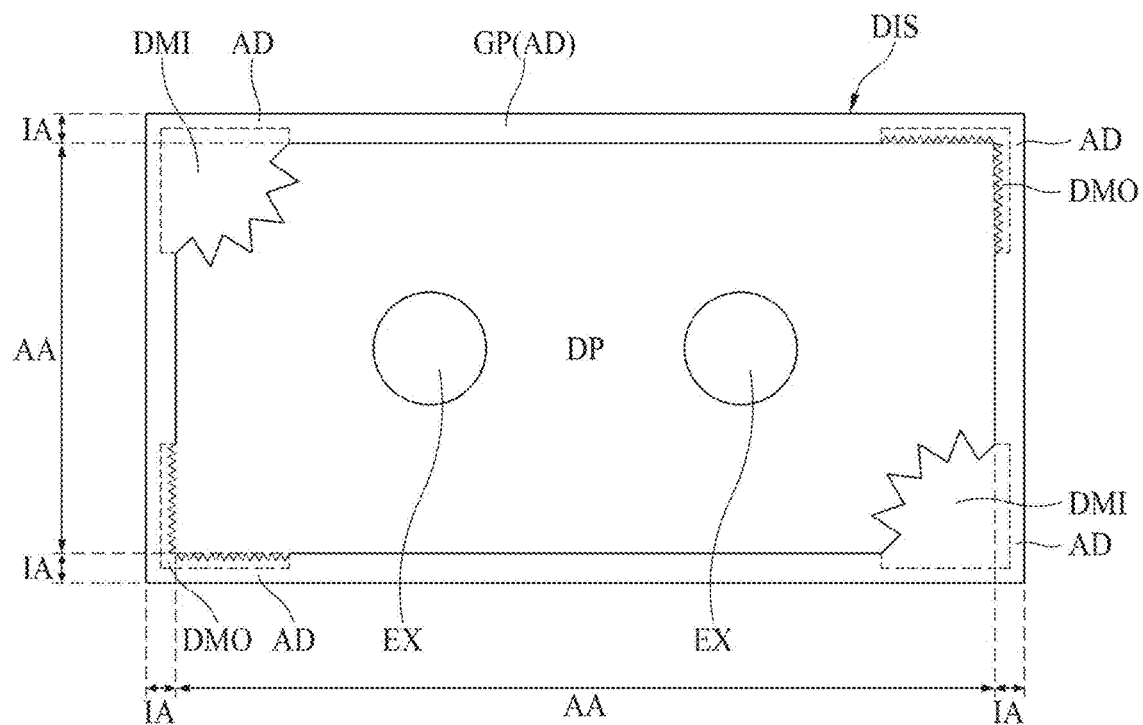
FIG. 6 is a rear side plan view illustrating a structure of a display apparatus according to the fifth embodiment of the present disclosure.

FIG. 6 is a rear side plan view illustrating a structure of a display apparatus according to the fifth embodiment of the present disclosure. In FIG. 6, the back cover BC is not shown unlike the previously referenced drawings illustrating the cross-sectional structure. In the fifth embodiment, the arrangement relationship among the guide panel GP, the adhesive fixing element DA and the vibration absorber DM viewed from the top view will be mainly described.

Referring to FIG. 6, the display apparatus according to the fifth embodiment of the present disclosure may comprise a display module DIS, a guide panel GP, a back cover BC, an adhesive fixing element AD and a sound generating unit EX. The display module DIS may include a display panel DP and a cover glass CG. The cover glass CG may include a display area AA and a non-display area IA. The display panel DP may be attached at inner surface of the display area AA of the cover glass CG.

The back cover BC may be attached at the rear surface of the display module DIS. In detail, the guide panel GP may be attached at non display area IA of the display module DIS. In addition, the back cover BC may be attached at the rear surface of the guide panel GP, but it is not represented on the plan view.

The guide panel GP may be attached as corresponding to the non-display area IA of the display module DIS. For example, the guide panel GP may be attached to the non-display area IA of the display module DIS using the adhesive fixing element AD. The vibration absorber DM is disposed inside the guide panel GP adjacent to the guide panel GP. The vibration absorber DM disposed in the non-display area IA may further include a plurality of extended protrusions DMI extending to an inner side of the display module DIS. The vibration absorber DM may be in close contact with the back surface of the display module DIS in the non-display area IA. In the interim, the extended protrusions DMI of the vibration absorber DM may extend to the display area AA to be in close contact with some parts of the display panel DP.

The extended protrusion DMI may have a structure in which a saw-tooth shape or a triangular shape having an irregular length and width is continuously arranged. The sound generating unit EX may produce a variety of complex vibration frequencies, so such a complex structure of the extended protrusion DMI may efficiently absorb these complex frequencies, and suppress the echo vibration.

In addition, the vibration absorber DM may further include a plurality of recessed protrusions DMO irregularly or regularly recessed outside the display module DIS in the non-display area IA of the display module DIS. The vibration absorber DM may be in close contact with the rear surface of the display module DIS in the non-display area IA. The recessed protrusion DMO which is recessed into the non-display area IA, may be attached to the rear surface of the display panel DIS at the non-display area IA (e.g., by the adhesive fixing element AD).

FIG. 6 shows that the extended protrusion DMI is disposed at the upper left corner and the lower right corner on the rear surface of the display module DIS, and the recessed protrusion DMO is disposed at the upper right corner and the lower left corner. However, the present disclosure is not limited thereto, and the extended protrusion DMI or the recessed protrusion DMO may be disposed at all four corners of the rear surface of the display module DIS.

The dotted line in FIG. 6 may be a boundary line separating the region of the adhesive fixing element AD and the region of the vibration absorber DM in the structure in which the guide panel GP is integrally configured with the vibration absorber DM. For example, the dotted line may be a boundary line separating the adhesive fixing area ADA and the vibration absorber DMA in FIG. 5.

The display apparatus according to the fifth embodiment of the present disclosure further comprises a vibration absorber DM disposed adjacent to the adhesive fixing element AD between the adhesive fixing member AD and the sound generating unit EX. In detail, the vibration absorber DM may include at least one of a plurality of extended protrusions DMI extending into the inner direction of the display module DIS and a plurality of recessed protrusions DMO recessed into the outer direction of the display module DIS. Accordingly, the vibration absorber DM and the extended protrusion DMI or the recessed protrusion DMO may suppress reverberant (or echo) vibration to acoustic vibration generated from the sound generating unit EX. Thereby, the acoustic vibration generated from the sound generating unit EX may be maintained in a high quality state.

Sixth Embodiment

Figure 7:
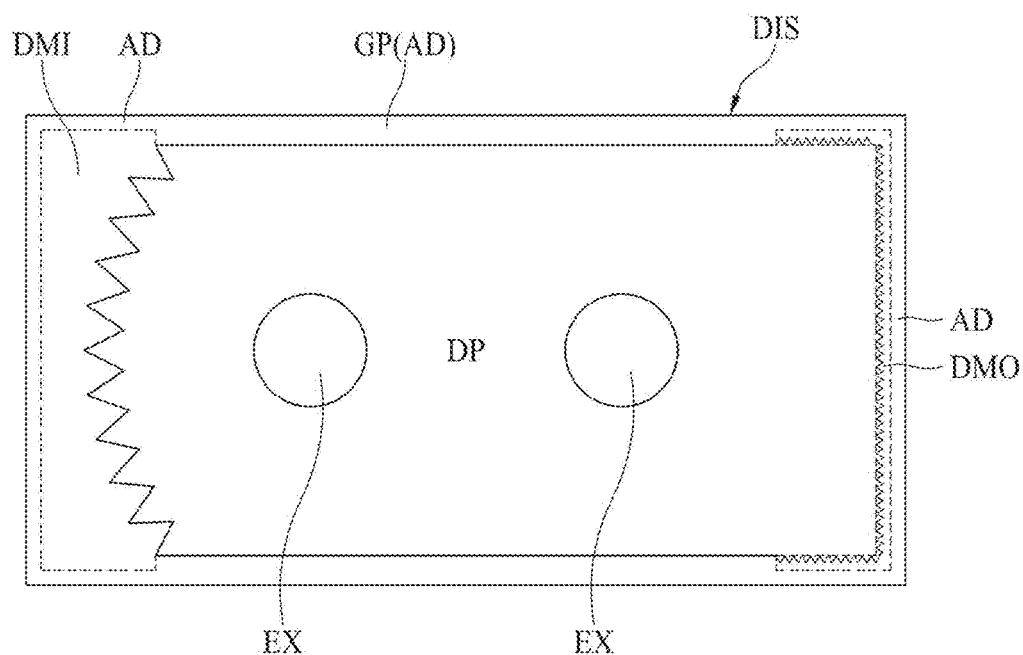
FIG. 7 is a rear side plan view illustrating a structure of a display apparatus according to the seventh embodiment of the present disclosure.

FIG. 7 is a rear side plan view illustrating a structure of a display apparatus according to the seventh embodiment of the present disclosure. In FIG. 7 like FIG. 6, the back cover BC is not shown unlike the previously referenced drawings illustrating the cross-sectional structure. The sixth embodiment may have the same structure with the fifth embodiment. The difference, in the sixth embodiment, is that the extended protrusion DMI and the recessed protrusion DMO may be disposed at any one side connecting two corners.

Referring to FIG. 7, the display apparatus according to the sixth embodiment of the present disclosure may comprise a display module DIS, a guide panel GP, a back cover BC, an adhesive fixing element AD and a sound generating unit EX. The display module DIS may include a display panel DP and a cover glass CG. The cover glass CG may include a display area AA and a non-display area IA. The display panel DP may be attached at inner surface of the display area AA of the cover glass CG.

The back cover BC may be attached at the rear surface of the display module DIS. In detail, the guide panel GP may be attached at non display area IA of the display module DIS. In addition, the back cover BC may be attached at the rear surface of the guide panel GP, but it is not represented on the plan view.

The guide panel GP may be attached as corresponding to the non-display area IA of the display module DIS. For example, the guide panel GP may be attached to the non-display area IA of the display module DIS using the adhesive fixing element AD. The vibration absorber DM is disposed inside the guide panel GP adjacent to the guide panel GP. The vibration absorber DM disposed in the non-display area IA may further include a plurality of extended protrusions DMI extending to an inner side of the display module DIS. The vibration absorber DM may be in close contact with the back surface of the display module DIS in the non-display area IA. In the interim, the extended protrusions DMI of the vibration absorber DM may extend to the display area AA to be in close contact with some parts of the display panel DP.

The extended protrusion DMI may have a structure in which a saw-tooth shape or a triangular shape having an irregular length and width is continuously arranged. The sound generating unit EX may produce a variety of complex vibration frequencies, so such a complex structure of the extended protrusion DMI may efficiently absorb these complex frequencies, and suppress the echo vibration.

In addition, the vibration absorber DM may further include a plurality of recessed protrusions DMO irregularly or regularly recessed outside the display module DIS in the non-display area IA of the display module DIS. The vibration absorber DM may be in close contact with the rear surface of the display module DIS in the non-display area IA. The recessed protrusion DMO which is recessed into the non-display area IA, may be attached to the rear surface of the display panel DIS at the non-display area IA (e.g., by the adhesive fixing element AD).

FIG. 7 shows that the extended protrusion DMI is disposed on the left side area, from the upper left corner to the lower left corner on the rear surface of the display module DIS. The recessed protrusion DMO is disposed on the right side area, from the upper right corner to the lower right corner on the rear surface of the display module DIS. However, the present disclosure is not limited thereto, and the extended protrusion DMI or the recessed protrusion DMO may be disposed at both sides facing each other on the rear surface of the display module DIS.

In one example, the extended protrusion DMI may be disposed as being across the top left corner, the left side and the bottom left corner. Further, the recessed protrusion DMO may be disposed as being across the top right corner, the right side and the bottom right corner. The extended protrusion DMI may be facing with the recessed protrusion DMO.

In another example, the recessed protrusion DMO may be disposed as being across the top left corner, the left side and the bottom left corner, while the extended protrusion DMI may be disposed as being across the top right corner, the right side and the bottom right corner. In still another example, the recessed protrusion DMO may be disposed as being across the top left corner, the top side and the top right corner, while the extended protrusion DMI may be disposed as being across the bottom left corner, the bottom side and the bottom right corner.

The dotted line in FIG. 7 may be a boundary line separating the region of the adhesive fixing element AD and the region of the vibration absorber DM in the structure in which the guide panel GP is integrally configured with the vibration absorber DM. For example, the dotted line may be a boundary line separating the adhesive fixing area ADA and the vibration absorber DMA in FIG. 5.

The display apparatus according to the sixth embodiment of the present disclosure may further include a vibration absorber DM between the adhesive fixing element AD and the sound generating unit EX, as being adjacent to the adhesive fixing element AD. In detail, the vibration absorber DM may include at least one of a plurality of extended protrusions DMI extending into the inner region of the display module DIS and a plurality of recessed protrusions DMO recessed into the outer region of the display module DIS. Accordingly, the vibration absorber DM and the extended protrusion DMI or the recessed protrusion DMO may suppress the reverberant vibration to the acoustic vibration generated from the sound generating unit EX. Thereby, the acoustic vibration created from the sound generating unit EX may be maintained in a high quality state.

Figure 8:
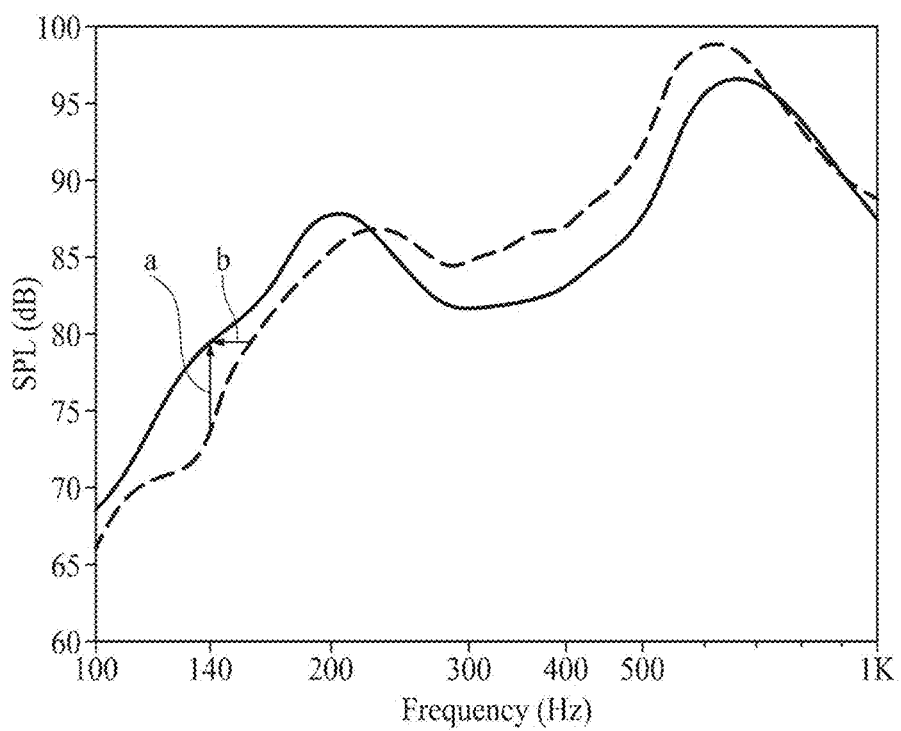
FIG. 8 is a graph showing the sound pressure level compared to the frequency measured at the display apparatus according to the various embodiments of the present disclosure.

With the display apparatus according to various embodiments of the present disclosure described above, an improved result may be obtained in the acoustic graph measurement as shown in FIG. 8. FIG. 8 is a graph showing the sound pressure level compared to the frequency measured at the display apparatus according to the various embodiments of the present disclosure. In FIG. 8, the solid line is a measurement graph of a sound pressure level versus frequency shown in a display apparatus having the structural characteristics according to the present disclosure. The dotted line is a graph of the sound pressure level versus frequency measured when the vibration absorber of the present disclosure is not provided. Here, the X-axis refers to the acoustic frequency band represented in the unit of Hz. Y-axis refers to the sound Pressure Level (SPL) represented in the unit of dB.

FIG. 8 shows an excellent sound pressure level in the low acoustic frequency band, specifically. For example, referring to the part marked with 'a', the sound pressure level is improved from 76 dB to 80 dB at the low frequency of about 140 Hz. In addition, referring to the part indicated by 'b', when the vibration absorber of the present disclosure is not applied, the lowest frequency of the frequency band having a sound pressure level of 80 dB is 160 Hz. However, when the vibration absorber of the present disclosure is applied, the lowest frequency of the frequency band having a sound pressure level of 80 dB is extended to 140 Hz.

Consequently, in the display panel including the vibration absorber according to the present disclosure, since the acoustic vibration provided from the sound generating unit is not reflected at the edge of the display panel but is eliminated or suppressed by the vibration absorber, the frequency band range for representing sounds may be wider and the sound pressure level of the frequency band may be further improved. This effect may be more effectively obtained at low frequency bands below 200 Hz, especially. Also, as shown in FIG. 8, in the display panel including the vibration absorber according to the present disclosure, a relatively flatter sound pressure level can be obtained in the low acoustic frequency band, and thus the sound quality of the display device can be improved.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A set apparatus comprises:
    a vibration plate;
    a guide panel at a rear edge of the vibration plate;
    a fixing member between the guide panel and the rear edge of the vibration plate;
    a vibration absorber at an inner side of the fixing member, and is a different material from the fixing member; and
    a vibration generating apparatus configured to vibrate the vibration plate,
    wherein the vibration absorber is disposed closer to the vibration generating apparatus than the fixing member.

2. The set apparatus of claim 1, wherein the vibration absorber comprises an elastic material.

3. The set apparatus of claim 1,
    wherein the vibration absorber comprises an elastic material, and
    wherein the fixing member comprises an adhesive medium.

4. The set apparatus of claim 1, wherein the fixing member comprises an organic adhesive material, a photo-curable adhesive material, or a heat-curable adhesive material.

5. The set apparatus of claim 1,
    wherein the fixing member is configured to be fixed to the rear edge of the vibration plate, and
    wherein the vibration absorber is configured to contact with the rear edge of the vibration plate.

6. The set apparatus of claim 1, wherein the vibration absorber comprises an inner corner portion including a round chamfer shape or a diagonal chamfer shape.

7. The set apparatus of claim 1, wherein a width of the vibration absorber is wider than a width of the fixing member.

8. The set apparatus of claim 7,
    wherein the guide panel comprises a front surface and an outer side,
    wherein the vibration absorber is between the front surface of the guide panel and the rear edge of the vibration plate; and
    wherein the fixing member covers the outer side of the guide panel and an outer side of the vibration absorber and is connected to the rear edge of the vibration plate.

9. The set apparatus of claim 8, wherein the vibration absorber comprises an inner side including a wave shape, a saw-tooth shape, or a straight shape.

10. The set apparatus of claim 7, wherein the vibration absorber comprises an inner corner portion including a round chamfer shape or a diagonal chamfer shape.

11. The set apparatus of claim 1, wherein a thickness of the vibration absorber is different from a thickness of the fixing member.

12. The set apparatus of claim 11, wherein the thickness of the vibration absorber is thicker than the thickness of the fixing member.

13. The set apparatus of claim 11, wherein the guide panel comprises a step pattern corresponding to the thickness of the vibration absorber and the thickness of the fixing member.

14. The set apparatus of claim 13, wherein the step pattern comprises a fixing area corresponding to the fixing member and a vibration absorbing area corresponding to the vibration absorber, and
    wherein the thickness of the fixing area is thicker than the thickness of the vibration absorbing area.

15. The set apparatus of claim 1, wherein the vibration absorber is configured in a portion of the guide panel.

16. The set apparatus of claim 15, wherein the vibration absorber comprises an extended portion at the portion of the guide panel to include a sawtooth shaped cross-sectional structure or a spring shaped cross-sectional structure.

17. The set apparatus of claim 16, wherein the guide panel comprises a rigid area corresponding to the fixing member, and
    wherein the extended portion extends from the rigid area to the vibration generating apparatus.

18. The set apparatus of claim 15, wherein the fixing member is further between the vibration absorber and a rear surface of the vibration plate.

19. The set apparatus of claim 1,
    wherein the guide panel comprises an inner side, and
    wherein the vibration absorber includes at least one of a plurality of extended protrusions protruded from the inner side of the guide panel to the vibration generating apparatus, and a plurality of recessed protrusions recessed from the inner side of the guide panel.

20. The set apparatus of claim 19,
    wherein the inner side of the guide panel comprises four corners, and
    wherein at least one of the extended protrusions and the recessed protrusions is disposed at least one of four corners of the inner side.

21. The set apparatus of claim 19,
    wherein the inner side of the guide panel further comprises four sides between four corners, and wherein at least one of the extended protrusions and the recessed protrusions is disposed at two sides of the four sides.

22. A vehicle, comprising:
a set apparatus including:
a vibration plate;
a guide panel at a rear edge of the vibration plate;
a fixing member between the guide panel and the rear edge of the vibration plate;
a vibration absorber at an inner side of the fixing member, and is a different material from the fixing member; and
a vibration generating apparatus configured to vibrate the vibration plate,
wherein the vibration absorber is disposed closer to the vibration generating apparatus than the fixing member.

* * * * *